United States Patent [19]

Fushida et al.

[11] Patent Number: 6,008,111
[45] Date of Patent: Dec. 28, 1999

[54] METHOD OF MANUFACTURING SEMICONDUCTOR DEVICE

[75] Inventors: Atsuo Fushida; Kenichi Goto; Tatsuya Yamazaki; Takae Sukegawa; Masataka Kase; Takashi Sakuma; Keisuke Okazaki; Yuzuru Ota; Hideo Takagi, all of Kanagawa, Japan

[73] Assignee: Fujitsu Limited, Kawasaki, Japan

[21] Appl. No.: 08/816,887

[22] Filed: Mar. 13, 1997

[30] Foreign Application Priority Data

Mar. 15, 1996 [JP] Japan ................................. 8-058865

[51] Int. Cl.⁶ .................................................. H01L 21/20
[52] U.S. Cl. .......................... 438/584; 438/592; 438/597; 438/620
[58] Field of Search .................................. 438/592, 584, 438/597, 620

[56] References Cited

U.S. PATENT DOCUMENTS 4,877,755 10/1989 Rodder .
5,750,437 5/1998 Oda .

FOREIGN PATENT DOCUMENTS 62-33466 2/1987 Japan .
5-291180 11/1993 Japan .

OTHER PUBLICATIONS

A New Salicide Process (PASET) for Sub–Half Micron CMOS, I. Sakai et al.; 1992 Symposium on VLSI Technology, 1992.

0.15μm CMOS Process for High Performance and High Reliability, S. Shimizu et al., International Electron Devices meeting, 1994, San Francisco, CA, Dec. 11–14, 1994.

A New Colbat Salicide Technology for 0.15μm CMOS Using High–Temperature Sputtering and In–Situ Vacuum Annealing, K. Inoue et al., International Electron Devices meeting, 1995, Washington, D.C., Dec. 10–13, 1995.

*Primary Examiner*—John F. Niebling
*Assistant Examiner*—Jonathan Hack
*Attorney, Agent, or Firm*—Armstrong, Westerman, Hattori, McLeland & Naughton

[57] ABSTRACT

A manufacturing method of a semiconductor device of the present invention comprises the steps of forming an amorphous layer on an upper layer of the impurity diffusion layer made of silicon by virtue of ion-implantation, forming a cobalt film on the impurity diffusion layer, forming a cobalt silicide layer made of $Co_2Si$ or $CoSi$ on an upper layer of the amorphous layer at a low temperature by reacting the cobalt film to silicon in the impurity diffusion layer in virtue of first annealing, then removing the cobalt film which has not reacted, and changing $Co_2Si$ or $CoSi$ constituting the cobalt silicide layer into $CoSi_2$ to have low resistance and also rendering the cobalt silicide layer to enter into a depth identical to or deeper than an initial depth of the amorphous layer in virtue of second annealing.

18 Claims, 17 Drawing Sheets

( I st. F.A. 450°C. 30min. AFTER WASHOUT )

(160 μm SQUARE)

(1280 μm SQUARE)

(2560 μm SQUARE)

(160 μm SQUARE)

(1280 μm SQUARE)

(2560 μm SQUARE)

$l = 3.35$ cm $l = 12.95$ cm (160um SQUARE)

(1280um SQUARE)

(2560um SQUARE)

(160μmSQUARE)

(1280μmSQUARE)

(2560μmSQUARE)

ℓ = 3.35 cm

ℓ = 12.95 cm

METHOD OF MANUFACTURING SEMICONDUCTOR DEVICE

BACKGROUND OF THE INVENTION

1. Field of the Invention

The present invention relates to a method of manufacturing a semiconductor device and, more particularly, a method of manufacturing a semiconductor device including salicide process.

2. Description of the Prior Art

Progress in high integration and high speed of semiconductor devices has been remarkable in recent years and thus it has been facilitated to enjoy high speed three dimensional image processing, high speed communication, etc. by a personal computer or a game machine at home. Such high performance can be attained by miniaturizing a CMOS device simply in size. Current CMOS devices whose gate length is about 0.35 μm have been in a mass-production stage, while CMOS devices whose gate length is 0.1 to 0.05 μm have been reported at a research level. However, in such devices that a gate length becomes shorter than 0.35 μm, parasitic resistances which do not meet a scaling rule are increased so that performance cannot be improved along conventional trends. Such a process that gate, source and drain regions are simultaneously formed as silicides to lower their resistances, i.e., a salicide (self-align silicide) process has become indispensable technology.

In the MOS transistor, increase in resistance of a diffusion layer is caused if the diffusion layer is made shallow to suppress the short channel effect. Therefore, such a technology has been examined that a surface of polysilicon constituting the gate electrode and surfaces of the source layer and the drain layer are formed as the silicides in a self-alignment manner to reduce their resistances. $TiSi_2$, $CoSi_2$, NiSi, or the like may be used as the silicide.

Next, ordinary manufacturing steps for the MOS transistor in which Co salicide is applied to surface layers of the gate, source, and drain electrodes will be explained.

First, as shown in FIG. 1A, a surface of a region of a silicon substrate 101 isolated by a LOCOS oxide film 102 is thermally oxidized to thereby form a gate oxide film 103 of an about 50 Å thickness. In turn, a polysilicon film 104 of an about 1500 Å thickness is formed on an overall surface by the CVD method.

Then, as shown in FIG. 1B, after any one of boron, phosphorous, and arsenic is ion-implanted into the polysilicon film 104, a gate electrode 105 is formed by patterning the polysilicon film 104. Thereafter, shallow impurity injection layers 106 are formed by ion-implanting phosphorous, for example.

Next, a silicon oxide film of an about 1000 Å thickness is formed by the CVD method and then anisotropic etching is carried out until an upper surface of the gate electrode 105 is exposed. As shown in FIG. 1C, the silicon oxide films remain on both side surfaces of the gate electrode 105 to be utilized as side walls 107.

After this, and after deep impurity injection layers 108 are formed by ion-implanting phosphorous, the shallow impurity injection layers 106 and the deep impurity injection layers 108 are activated by annealing process. As a result, the source layer (109) and the drain layer (110) are formed on both sides of the gate electrode 105 in the silicon substrate 101 as a LDD structure.

Subsequently, after silicon oxide films (natural oxide films) formed on surfaces of the gate electrode 105, the source layer 109 and the drain layer 110 are removed by buffered hydrogen fluoride, as shown in FIG. 1D, a cobalt film 111 of an about 100 Å thickness and a titanium nitride film 112 of an about 300 Å thickness are formed and then silicide formation is executed by RTA (rapid thermal annealing) process at 550° C. for 30 seconds to form cobalt silicide layers 113.

Then, as shown in FIG. 1E, by removing the titanium nitride film 112 and the unreacted cobalt film 111 and executing RTA process at 850° C. for 30 seconds, cobalt silicide layers 113 formed on the gate electrode 105, the source layer 109 and the drain layer 110 are made to have further low resistance.

Such salicide technology is a basic manufacturing step. As improved technologies for the salicide technology, planarization technology for the silicide layer has been disclosed in Patent Application Publication (KOKAI) 62-33466 and film thickness uniformization technology for the silicide layer has been set forth in Patent Application Publication (KOKAI) 5-291180.

SUMMARY OF THE INVENTION

It is an object of the present invention to provide a method of manufacturing a semiconductor device including a step to suppressing flow of leakage current from an impurity diffusion layer having a cobalt silicide layer on its surface to a substrate.

There is no problem particularly in forming the cobalt silicide layer according to salicide technology if the source layer and the drain layer are formed deep, but the above object is set based on experimental results derived by the present inventors to the effect that leakage current is easy to flow if a depth is made shallow up to about 100 nm, for example.

The fact may be guessed as its cause that cobalt silicide spikes have been grown from the bottom of the cobalt silicide layer to thus penetrate through the source layer and the drain layer. Such cobalt silicide spikes have been produced even if the cobalt silicide layer is formed according to methods and temperature conditions which have been set forth in the above Patent Application Publications (KOKAIs).

According to the manufacturing method of the semiconductor device of the present invention, in order to form cobalt silicide layers on the upper layer portions of the impurity diffusion layers, there are comprised the steps of forming an amorphous layer on an upper layer of the impurity diffusion layer made of silicon by virtue of ion-implantation, forming a cobalt film on the impurity diffusion layer, forming a cobalt silicide layer made of $Co_2Si$ or CoSi on an upper layer of the amorphous layer at a low temperature by reacting the cobalt film to silicon in the impurity diffusion layer in virtue of first annealing, then removing the cobalt film which has not reacted, and changing $Co_2Si$ or CoSi constituting the cobalt silicide layer into $CoSi_2$ to have low resistance and also rendering the cobalt silicide layer to enter into a depth identical to or deeper than an initial depth of the amorphous layer in virtue of second annealing.

According to such steps, upon first and second annealings to form the cobalt silicide layer, downward migration of constituent elements of the cobalt silicide layer can be prevented by the amorphous layer and spikes of the cobalt silicide layer can be prevented from being generated. Furthermore, even if the amorphous layer is recrystallized by widening the cobalt silicide layer up to an initial depth of the amorphous layer upon second annealing, the recrystallization may be intruded by the cobalt silicide layer. Therefore, junction between recrystallization with high resistance and the cobalt silicide layer can be prevented and therefore increase in contact resistance can be prevented.

Since recrystallization of the amorphous layer starts from its bottom if the temperature of the first annealing is more than 450° C., an advantage of amorphization cannot be achieved sufficiently. Further, if the temperature of the second annealing exceeds the temperature to activate the impurity diffusion layer, such temperature is not preferable since leakage current is increased because of melting of cobalt from the silicide layer at junction portion between the impurity diffusion layers and their peripheral portions.

The cobalt silicide layer is used for the source layer and the drain layer of the MOS transistor and the like to reduce their resistance.

Germanium or silicon with large mass, or arsenic used for dopant may be preferable, though not limited particularly, as the elements ion-implanted to form the amorphous layer.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1A:
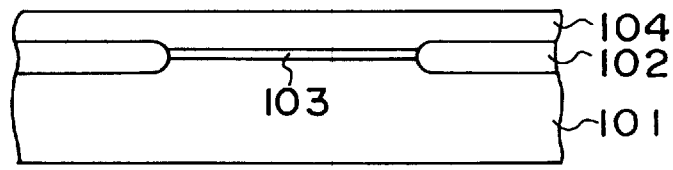
FIGS. 1A to 1E are sectional views illustrating steps of forming a cobalt silicide layer in the prior art.
Figure 1B:
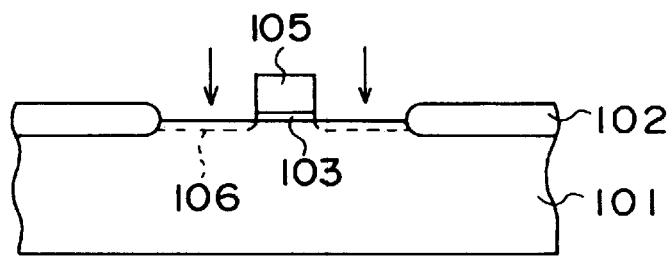
Figure 1C:
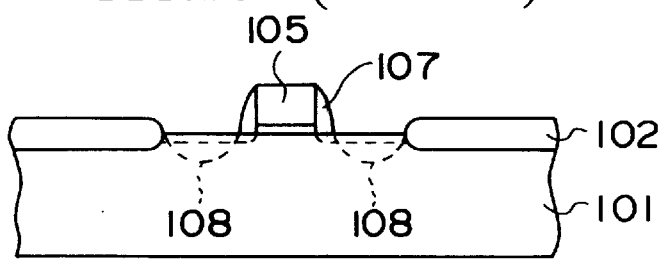
Figure 1D:
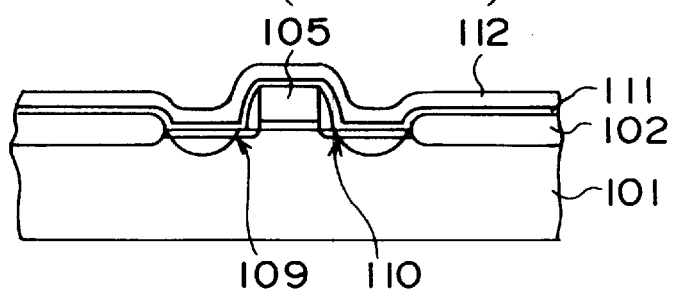
Figure 1E:
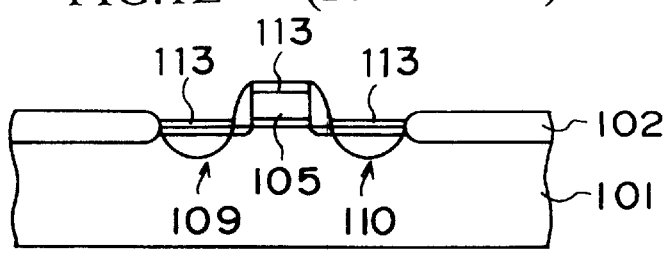

Various embodiments of the present invention will be described with reference to the accompanying drawings. It should be noted that the same or similar reference numerals are applied to the same or similar parts and elements throughout the drawings, and the description of the same or similar parts and elements will be omitted or simplified.

FIGS. 2A to 2J are sectional views illustrating steps of manufacturing a semiconductor device according to an embodiment of the present invention.

Figure 2A:
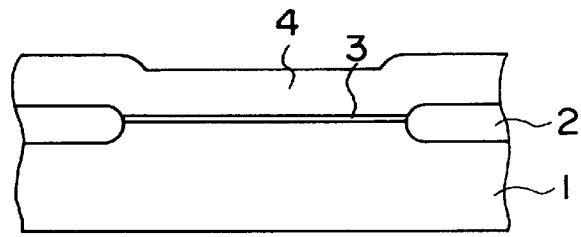
FIGS. 2A to 2J are sectional views illustrating steps of manufacturing a semiconductor device according to an embodiment of the present invention.

At first, as shown in FIG. 2A, a surface of a region of a silicon substrate 1 isolated by LOCOS oxide films 2 is thermally oxidized to thus form a gate oxide film 3 of about 5 nm thickness. Subsequently, a polysilicon film 4 is formed on the gate oxide film 3 and the LOCOS oxide film 2 by the CVD method to have a thickness of about 150 nm.

Figure 2B:
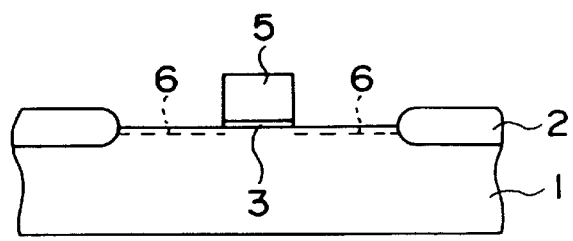

Then, as shown in FIG. 2B, for example, arsenic is ion-implanted into the polysilicon film 4, then the gate oxide film 3 and the polysilicon film 4 are patterned to a gate electrode 5 by means of the polysilicon film 4. The gate electrode 5 is formed to cross the center area of a region isolated by LOCOS oxide films 2. After this, a shallow impurity implanted layer 6 is formed by ion-implanting arsenic into the silicon substrate 1 with the use of the gate electrode 5 as a mask. In this ion-implantation, a dosage is $3 \times 10^{14}$ atm/cm$^2$ and acceleration energy is 10 keV, for purposes of example.

Figure 2C:
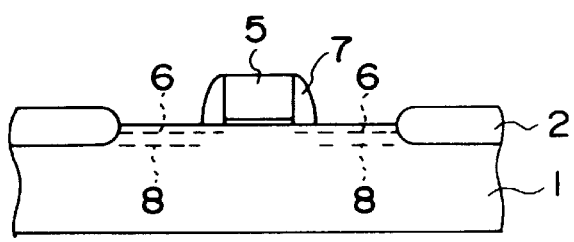

In turn, a silicon oxide film of about 100 nm thickness is formed on an overall surface by the CVD method. Then, the silicon oxide film is etched in the vertical direction by means of anisotropic etching until an upper surface of the gate electrode 5 is exposed, so that the silicon oxide film remains on both sides of the gate electrode 5 as side walls 7, as shown in FIG. 2C. The anisotropic etching is carried out by reactive ion etching (RIE).

Then, arsenic is ion-implanted into the silicon substrate 1 using the gate electrode 5 as a mask to form a deep impurity injection layer 8. In this ion-implantation, a dosage is $2 \times 10^{15}$ atm/cm$^2$ and acceleration energy is 40 keV, for example.

Figure 2D:
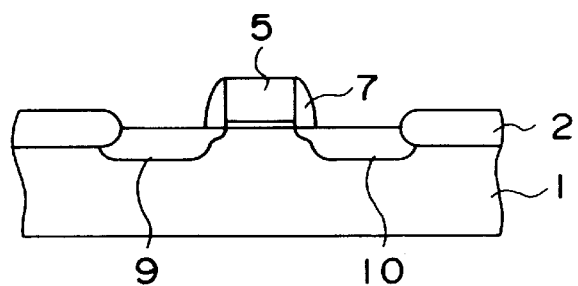

Next, in terms of RTA process at 1000° C. for ten seconds, arsenic implanted in the gate electrode 5 is diffused and simultaneously arsenic implanted in the shallow impurity injection layer 6 and the deep impurity injection layer 8 is activated. As a result, as shown in FIG. 2D, a source layer 9 and a drain layer 10 are formed on both sides of the gate electrode 5 in the silicon substrate 1 as an LDD structure. In this event, the source layer 9 and the drain layer 10 are formed to a depth about 100 nm from a surface of the silicon substrate 1 in regions which are not overlapped with the side walls 7.

Figure 2E:
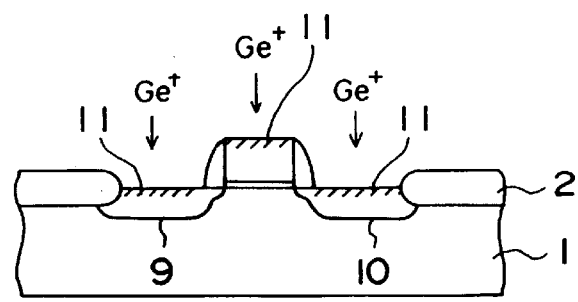

Thereafter, as shown in FIG. 2E, germanium is ion-implanted into an overall surface including the source layer 9 and the drain layer 10 to thereby form an amorphous (non-crystalline) layer 11 on surfaces of the gate electrode 5, the source layer 9 and the drain layer 10. A dosage of this ion-implantation is set more than $8 \times 10^{13}$ atm/cm$^2$. A magnitude of acceleration energy of this ion-implantation is selected such that the amorphous layer 11 is formed shallow rather than at the bottom of the source layer 9 and the drain layer 10 and that the amorphous layer 11 should not disappear in first annealing for silicide formation executed later but disappear in second annealing for silicide formation executed further later.

More particularly, though depending on a depth of the silicide layer to be formed later, a magnitude of acceleration energy is selected in a range of 20 to 40 keV in case the source layer 9 and the drain layer 10 are 100 nm in depth.

Next, natural oxide films (silicon oxide films) formed on surfaces of the gate electrode 5, the source layer 9 and the drain layer 10 are removed by buffered hydrogen fluoride (BHF). This BHF is a mixed solution in which hydrogen fluoride and water are mixed at a rate of 2:100. A time required for such removing is about 60 seconds.

Figure 2F:
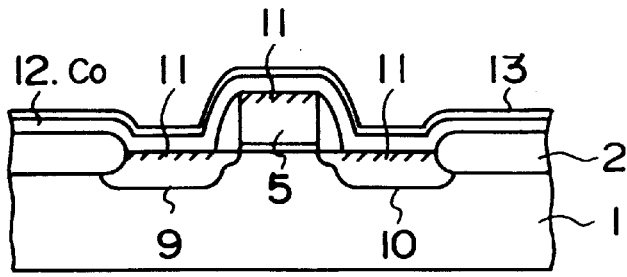

As shown in FIG. 2F, a cobalt (Co) film 12 of about 8 to 20 nm thickness and a titanium nitride (TiN) film (cap layer) 13 of about 30 nm thickness are formed by sputtering in sequence on an entire surface of the resultant structure.

Upon growing the cobalt film 12, pressure in growth atmosphere is 5 mTorr, a flow rate of argon gas supplied to the growth atmosphere is 100 sccm, and DC electric energy applied to a cobalt target is 0.2 W/cm$^2$. A thickness of the cobalt film 12 would be increased with the increase of ion implantation energy of germanium.

Further, upon growing the titanium nitride film 13, pressure in the growth atmosphere is 5 mTorr, a flow rate of argon gas supplied to the growth atmosphere is 50 sccm, a flow rate of nitrogen gas is 50 sccm, and DC electric energy applied to a titanium nitride target is 7.0 W/cm$^2$. The titanium nitride film 13 is formed to suppress surface unevenness of the silicide layer during silicide formation process.

Figure 2G:
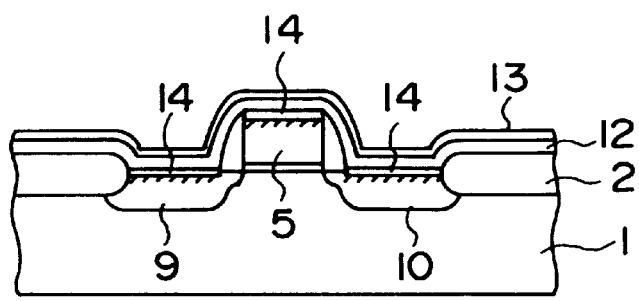

Succeedingly, the first annealing for silicide formation is carried out. In other words, as shown in FIG. 2G, if respective surfaces of the gate electrode 5, the source layer 9 and the drain layer 10 are formed as silicides in terms of RTA at 400 to 450° C. for 30 seconds in nitrogen or argon atmosphere, cobalt silicide layers 14 made of $Co_2Si$ or $CoSi$ are formed in upper surface regions of the amorphous layers 11. The cobalt silicide layers 14 are not formed if the RTA temperature is less than 400° C., but the RTA temperature in excess of 450° C. is not desired since regions beneath the amorphous layers 11 are recrystallized. According to this annealing, besides the cobalt silicide layers 14 are spread into upper surface regions of the amorphous layers 11 to thus cause disappearance of such regions, bottom surface regions of the amorphous layers 11 are recrystallized. Therefore, the amorphous layers 11 can be prevented from disappearing in this stage by optimizing ion implantation energy of germanium described above to thus remain though they are very thin.

Figure 2H:
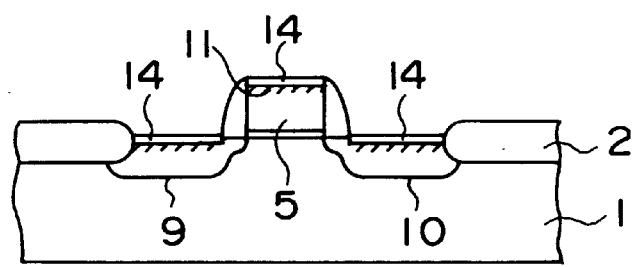

Then, as shown in FIG. 2H, the titanium nitride film 13 is removed by immersing a resultant structure in a hydrogen peroxide/ammonia liquid mixture solution ($H_2O_2:NH_4OH:H_2O=1:1:4$) heated up to 70° C. for 180 seconds, then the unreacted cobalt film 12 is removed by immersing a resultant structure in a sulfuric acid/hydrogen peroxide mixture solution ($H_2SO_4:H_2O_2=3:1$) for twenty minutes. In this case, the cobalt silicide layers 14 remain as they are.

Figure 2I:
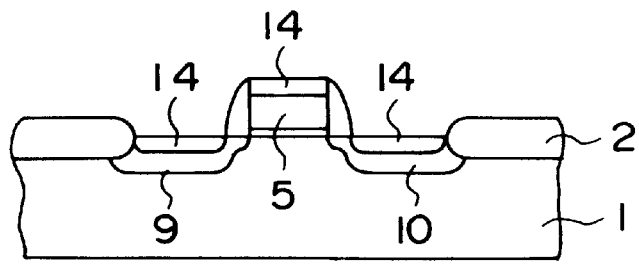

Next, the second annealing for silicide formation is carried out. In other words, as shown in FIG. 2I, the cobalt silicide layers 14 are heated in nitrogen or argon atmosphere within the temperature range of 600 to 900° C. Thereby, the cobalt silicide layers 14 are changed from $Co_2Si$ or $CoSi$ to $CoSi_2$ to lower their resistance. In this case, if annealing temperature is less than 600° C., low resistance of the cobalt silicide layers 14 cannot be achieved since $CoSi_2$ is hard to be generate. Conversely, if annealing temperature becomes higher than 900° C., Co atoms are melted away from the cobalt silicide layers 14 to thus increase junction leakage.

Assuming that a remaining thickness of the impurity diffusion layer constituting the source layer 9 and the drain layer 10 is set to 1, a thickness of the cobalt silicide layers 14 become about 0.5 to 2.0 at this stage.

Figure 2J:
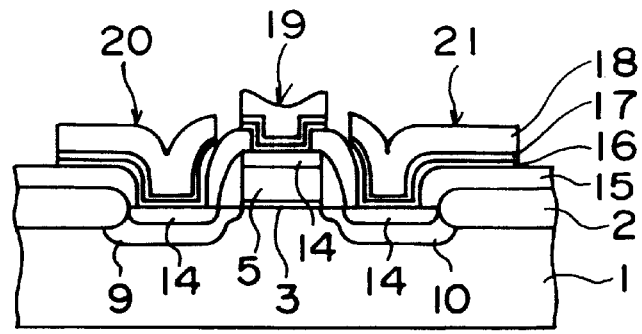

After this, as shown in FIG. 2J, a silicon oxide film ($SiO_2$) 15 of 700 nm thickness is formed on an entire surface by the CVD method. In turn, contact holes are opened on the gate electrode 5, the source layer 9 and the drain layer 10 by patterning the silicon oxide film 15, then a titanium film 16 of 20 nm thickness, a titanium nitride film 17 of 100 nm thickness and an aluminum layer 18 of 500 nm thickness are formed, then these layers 16 to 18 are patterned by means of the photolithography method, whereby a gate leading electrode 19, a source leading electrode 20 and a drain leading electrode 21 are formed.

Although germanium has been used as ion-implantation element to form the amorphous layers 14 in the above explanation, other elements such as silicon, arsenic, or boron may be used. Taking into account mass of element, control of impurity concentration in the impurity diffusion layer, etc., germanium or silicon is desired. A dosage is set more than $8 \times 10^{13}$ atoms/cm$^2$ if germanium is used, a dosage is set more than $8 \times 10^{14}$ atoms/cm$^2$ if silicon is used, and a dosage is set more than $8 \times 10^{13}$ atoms/cm$^2$ to $5 \times 10^{14}$ atoms/cm$^2$ if arsenic is used.

In a MOS transistor formed according to the above steps, spikes are hardly caused on the bottoms of the cobalt silicide layers 14 so that leakage current can be suppressed.

Generation of the spikes in the cobalt silicide layer 14 will be explained in detail hereinbelow.

Figure 3A:
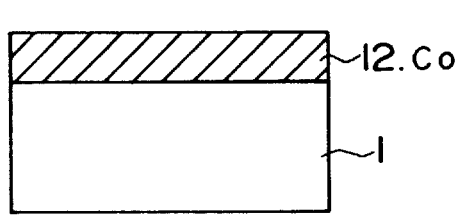
FIGS. 3A to 3D are sectional views showing experimental processes in compliance with cobalt silicide forming steps in the prior art.

As shown in FIG. 3A, after the cobalt layer 12 of 10 nm thickness is formed on the silicon substrate 1 without amorphization of the silicon substrate 1, a first experiment to be described hereinbelow has been performed.

Figure 3B:
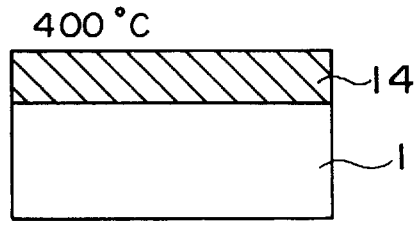
Figure 3C:
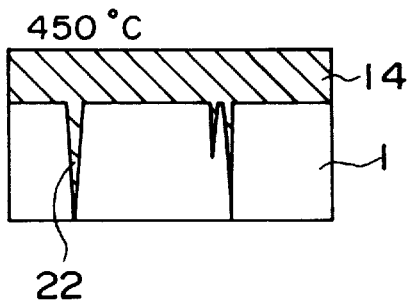
Figure 3D:
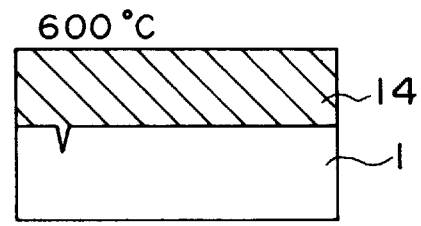
Figure 4:
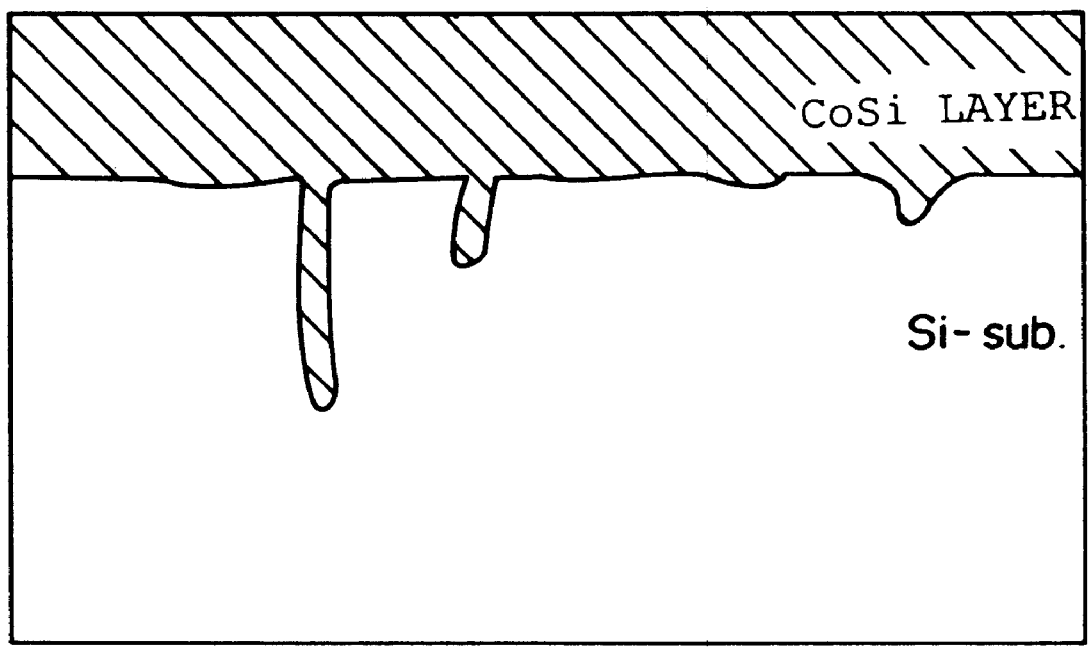
FIG. 4 is a sectional view showing an example of spike generated by the cobalt silicide forming steps in the prior art.

First, as shown in FIG. 3B, if the cobalt layer 12 and the silicon substrate 1 are heated at 400° C., the cobalt suicide layer 14 made of $Co_2Si$ was formed on a surface layer of the silicon substrate 1. Next, as shown in FIG. 3C, if the cobalt silicide layer 14 and the silicon substrate 1 are heated at 450° C., $Co_2Si$ constituting the cobalt silicide layer 14 was changed into CoSi. In this event, the spikes 22 were formed on the bottom of the cobalt silicide layer 14. Subsequently, as shown in FIG. 3D, if the cobalt silicide layer 14 is heated at 600° C., CoSi was changed into $CoSi_2$ and the spikes 22 still remained on the bottom of the cobalt silicide layer 14. A sectional shape of an interface between $CoSi_2$ and Si, if viewed by TEM, after removal of unreacted cobalt is shown in FIG. 4. The interface was uneven. Icicle-like abnormal growths (spikes) having a length about 80 nm at maximum were formed.

Figure 5A:
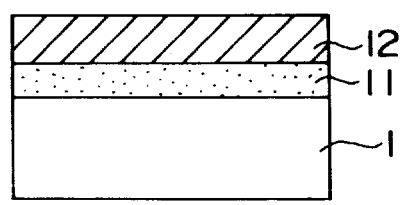
FIGS. 5A to 5D are sectional views showing experimental processes if an amorphous layer is too shallow in forming the cobalt silicide.

As shown in FIG. 5A, after the silicon substrate 1 was amorphizied up to a shallow depth from its surface, the cobalt layer 12 of 10 nm thickness was formed on the silicon substrate 1, then a second experiment to be described hereinbelow has been performed.

Figure 5B:
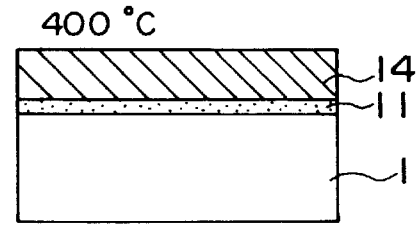
Figure 5C:
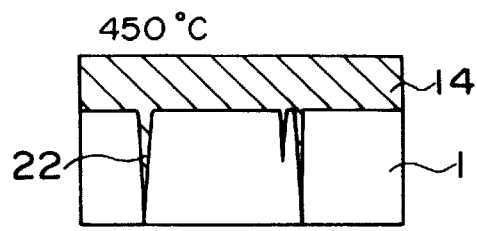
Figure 5D:
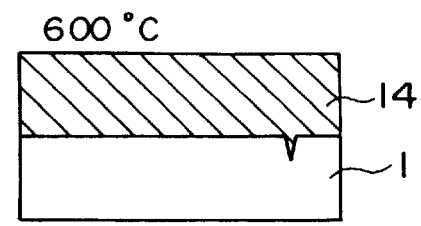

As shown in FIG. 5B, if the cobalt layer 12 and the silicon substrate 1 are heated at 400° C., the cobalt silicide layer 14 made of $Co_2Si$ was formed on the surface layer of the silicon substrate 1 and a thin amorphous layer 11 remained beneath the cobalt silicide layer 14. Then, as shown in FIG. 5C, if the cobalt silicide layer 14 and the silicon substrate 1 both have been subjected to annealing process at 400° C. are still heated at 450° C., $Co_2Si$ constituting the cobalt silicide layer 14 was changed into CoSi and in addition the cobalt silicide layer 14 intruded completely into the amorphous layer 11. The spikes 22 were caused on the bottom surface of the cobalt silicide layer 14. Furthermore, as shown in FIG. 5D, if the cobalt silicide layer 14 is heated at 600° C. once again, the cobalt silicide layer 14 made of $CoSi_2$ was formed and the spikes 22 still remained on the bottom of the cobalt silicide layer 14.

Figure 6A:
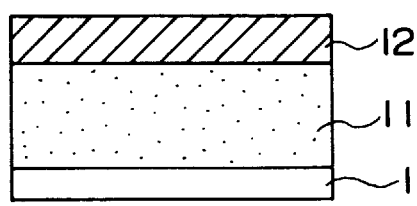
FIGS. 6A to 6D are sectional views showing experimental processes if an amorphous layer is too deep in forming the cobalt silicide.

As shown in FIG. 6A, after the surface of the silicon substrate 1 was amorphizied up to a deep depth, the cobalt layer 12 of 10 nm thickness was formed on the silicon substrate 1, then a third experiment to be described hereinbelow has been performed.

Figure 6B:
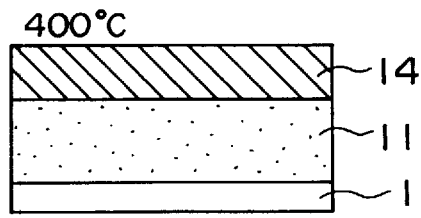
Figure 6C:
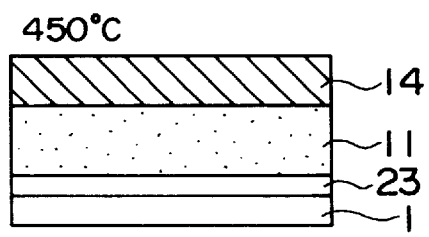
Figure 6D:
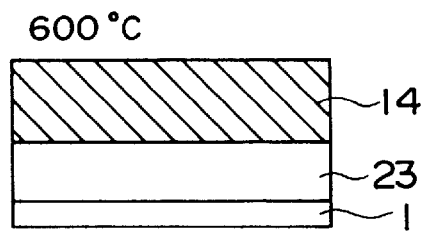

As shown in FIG. 6B, if the cobalt layer 12 and the silicon substrate 1 are heated at 400° C., the cobalt silicide layer 14 made of $Co_2Si$ was formed on the surface layer of the silicon substrate 1 and a thick amorphous layer 11 still remained beneath the cobalt silicide layer 14. Then, as shown in FIG. 6C, if the cobalt silicide layer 14 and the silicon substrate 1 both have been subjected to annealing process at 400° C. are further heated at 450° C., $Co_2Si$ constituting the cobalt silicide layer 14 was changed into CoSi and the amorphous layer 11 still remained beneath the cobalt silicide layer 14, nevertheless the bottom of the amorphous layer 11 was slightly recrystallized to thus disappear. As shown in FIG. 6D, if the cobalt silicide layer 14 is heated at 600° C. once again, the cobalt silicide layer 14 made of $CoSi_2$ was formed and no spike 22 was caused and in addition a single crystal silicon layer 23 which was generated due to recrystallization of the amorphous layer 11 resided beneath the cobalt silicide layer 14.

Accordingly, in order to prevent the spikes from being generated from the cobalt silicide layer 14, the amorphous layer 11 may, in a sense, be formed sufficiently deep according to the steps in the third experiment. However, the temperature of about 850° C. is not sufficient to activate impurity included in the amorphous layer 11 since, as shown in FIGS. 2F to 2H, actually the source layer 9 and the drain layer 10 reside in the recrystallized silicon layer 23, so that contact resistances between the cobalt silicide layer 14 and the source layer/the drain layer cannot be reduced sufficiently. As a result, the initial object of silicide formation, i.e., reduction in resistances of the source layer 9 and the drain layer 10, cannot be achieved.

Figure 7A:
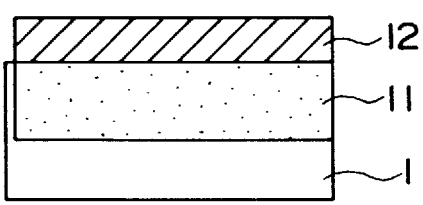
FIGS. 7A to 7D are sectional views showing experimental processes in the embodiment of the present invention if an amorphous layer is optimal in forming the cobalt silicide.

Then, as shown in FIG. 7A, after the surface layer of the silicon substrate 1 was amorphized, the cobalt layer 12 was formed to have a thickness of 10 nm, then a fourth experiment to be described hereinbelow has been performed. In this experiment, a depth of the amorphous layer 11 has been set to an appropriate value, i.e., the depth has been selected to such an extent that the amorphous layer 11 remains beneath the cobalt silicide layer 14 after the first annealing but the recrystallized silicon layer 23 of the amorphous layer 11 is intruded by the cobalt silicide layer 14 by the second annealing at 600° C.

Figure 7B:
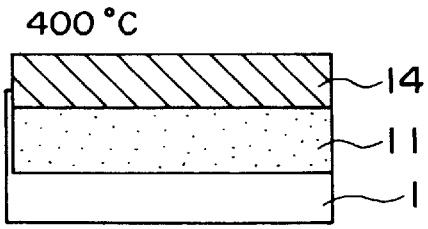
Figure 7C:
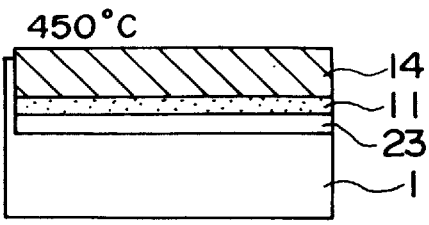

At first, as shown in FIG. 7B, when the cobalt layer 12 and the silicon substrate 1 were heated at 400° C. for 30 seconds, the cobalt silicide layer 14 made of $Co_2Si$ was formed on the surface layer of the silicon substrate 1 and the amorphous layer 11 remained beneath the cobalt silicide layer 14. Subsequently, as shown in FIG. 7C, if the cobalt silicide layer 14 and the silicon substrate 1 are heated still further at 450° C. for 30 seconds, $Co_2Si$ composing the cobalt silicide layer 14 was changed into CoSi. At that time, a thickness of the cobalt silicide layer 14 was 20.2 nm and in this state the cobalt silicide layer 14 was projected from the surface of the silicon substrate 1 by 2.0 nm. The amorphous layer 11 and the recrystallized silicon layer 23 lay beneath the cobalt silicide layer 14. A thickness of these layers was less than 18.2 nm in total amount.

Figure 7D:
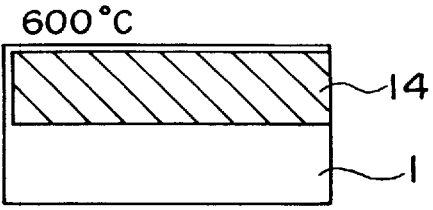

In addition, as shown in FIG. 7D, if the cobalt silicide layer 14 and the silicon substrate 1 are heated at 600° C. for 30 seconds once again, CoSi composing the cobalt silicide layer 14 was changed into $CoSi_2$ and the cobalt silicide layer 14 was made thicker by 35.2 nm. In this case, since the cobalt silicide layer 14 was formed below by 1.2 nm from the surface of the silicon substrate 1, the initial amorphous layer 11 was intruded completely by the cobalt silicide layer 14 and further the recrystallized silicon layer 23 did not lie beneath the cobalt silicide layer 14.

Therefore, the source layer 9 and the drain layer 10 underlying the cobalt silicide layer 14 can still maintain their low resistance states which have been derived by activating at about 1000° C. at first. Consequently, contact resistances between the cobalt silicide layer 14 and the source layer 9 and the drain layer 10 was kept good. Further, no abnormal growth in FIG. 4 has been found by TEM view for the interface between $CoSi_2$ and Si and the interface between the cobalt silicide layer 14 and the source layer 9 and the drain layer 10 has been formed relatively flat.

With the above description, it has been found that, if the cobalt film of 10 to 20 nm thickness is formed and then the cobalt silicide layer 14 made of $CoSi_2$ is formed by annealing the cobalt film at the temperatures of 400 to 450° C. for the first time and then 600 to 900° C. for the second time for 30 seconds respectively, the amorphous layer 11 must be formed to have a depth of more than about 18.2 nm to 26.4 nm and less than 35.2 nm to 70.2 nm in each annealing.

Figure 8:
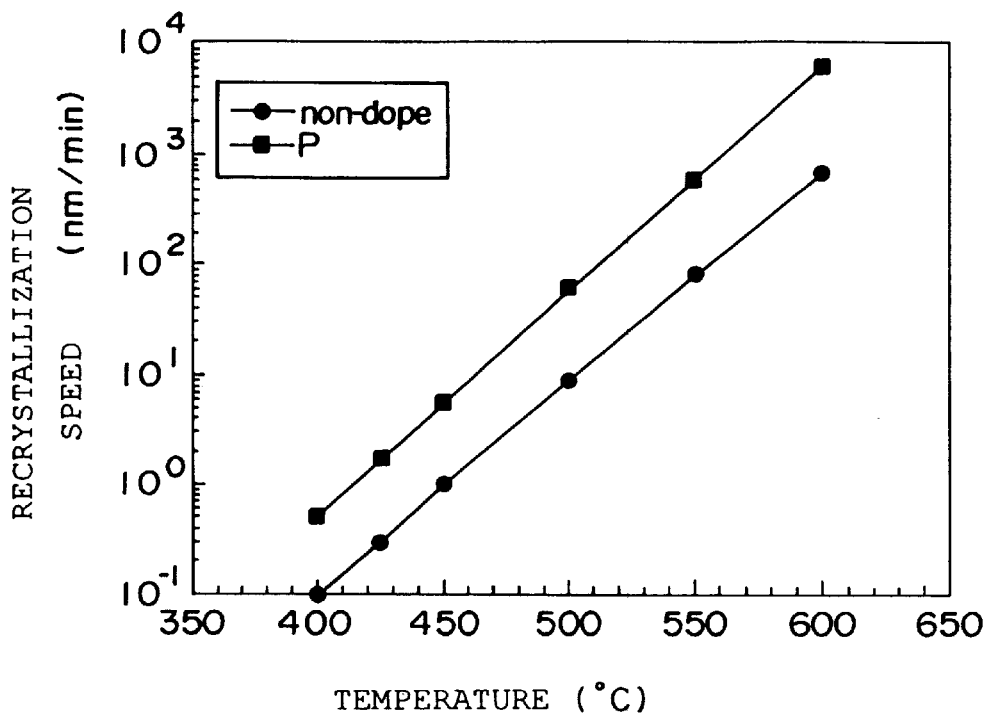
FIG. 8 is a characteristic view showing relationships between recrystallization speed of the amorphous layer formed according to the embodiment of the present invention and temperature.

In case the silicide layer 14 made of $Co_2Si$ or CoSi is formed, such temperature condition to cause silicide formation reaction and to render recrystallization speed of the amorphous layer 11 extremely slow was effective. For instance, as shown in FIG. 8, recrystallization speed of the amorphous layer 11 has become extremely slow if the temperature is less than 450° C. Moreover, it would be understood that, if the amorphous layer 11 is to be formed, recrystallization speed has become slower in the impurity contained amorphous layer rather than the impurity not-contained amorphous layer. Incidentally, a logarithmic scale is applied to a vertical axis in FIG. 8.

Figure 9:
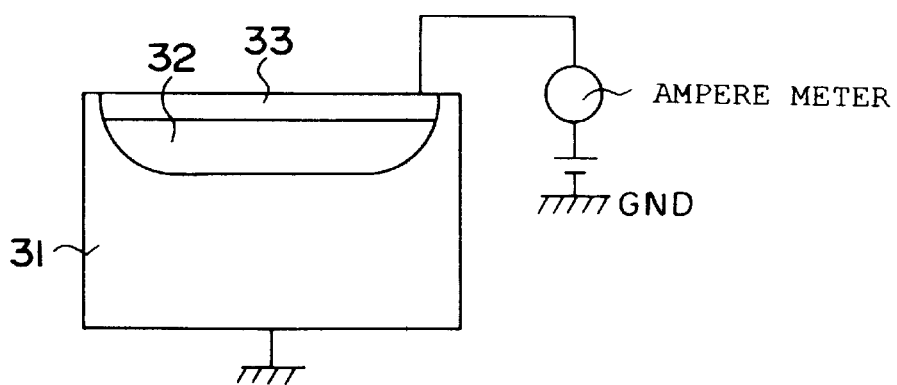
FIG. 9 is a sectional view showing a testing state to test a magnitude of the leakage current in an impurity diffusion layer.

Finally, leakage current caused in the cobalt silicide layer will be explained next. As shown in FIG. 9, the leakage current has been measured in such a manner that a silicon substrate 31 is grounded while positive voltage is applied to a cobalt silicide layer 33 formed on an impurity diffusion layer (source and drain layer) 32.

To begin with, the case will be explained where germanium is not ion-implanted.

Figure 10A:
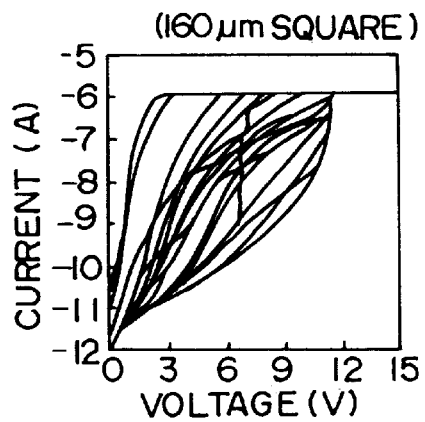
FIGS. 10A to 10C are characteristic views showing leakage current due to difference in areas of the cobalt silicide layers which are formed according to the prior art and from which unreacted cobalt is removed after first annealing.
Figure 10B:
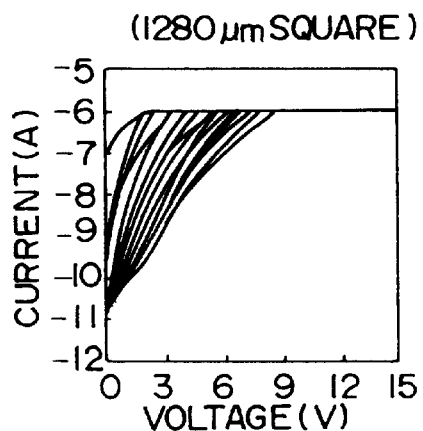
Figure 10C:
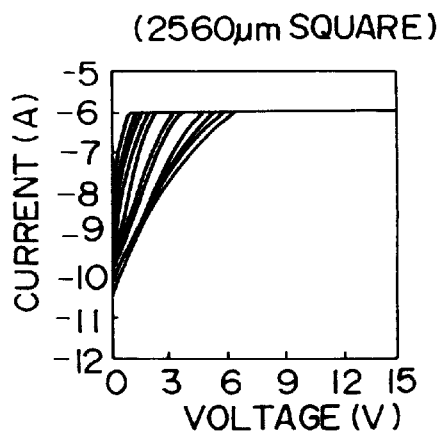
Figure 11A:
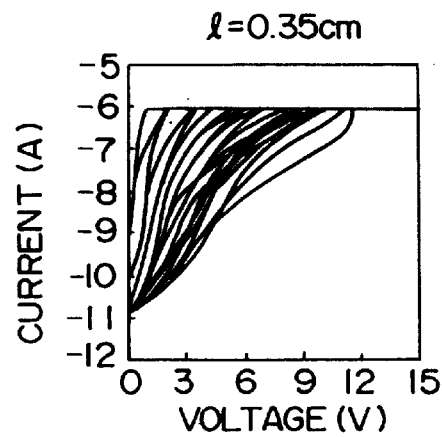
FIGS. 11A to 11C are characteristic views showing leakage current due to difference in peripheral lengths of the cobalt silicide layers which are formed according to the prior art and from which unreacted cobalt is removed after first annealing.
Figure 11B:
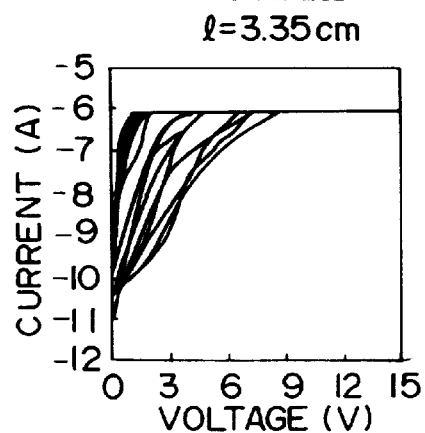
Figure 11C:
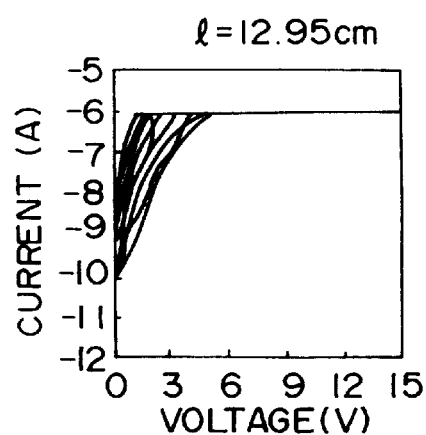

The cobalt silicide layer 33 was formed by virtue to first RTA executed at 550° C. for 30 seconds and then unreacted cobalt was removed. If relationships between leakage current and bias voltage (referred to as "leakage current characteristics" hereinbelow) have been examined by varying a flat area of the impurity diffusion layer 32 immediately after such removal, i.e., immediately after washout process, results shown in FIGS. 10A to 10C have been derived. In addition, if leakage current characteristics are examined while varying a peripheral length of the impurity diffusion layer 32, results shown in FIGS. 11A to 11C have been obtained.

Figure 12A:
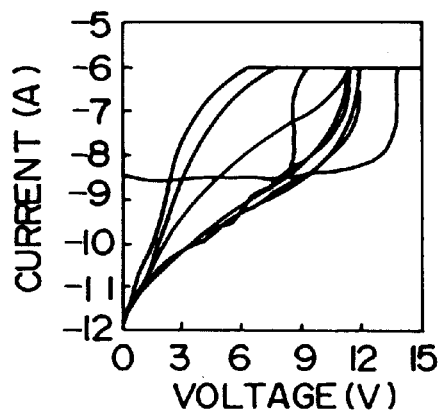
FIGS. 12A to 12C are characteristic views showing leakage current due to difference in areas of the cobalt silicide layers which are formed according to the prior art and from which unreacted cobalt is removed after second annealing.
Figure 12B:
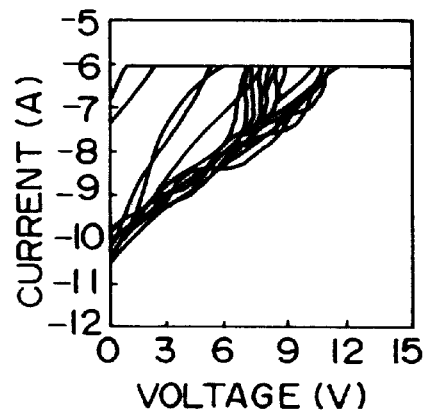
Figure 12C:
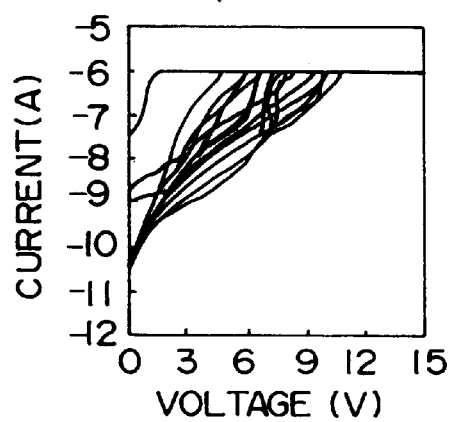
Figure 13A:
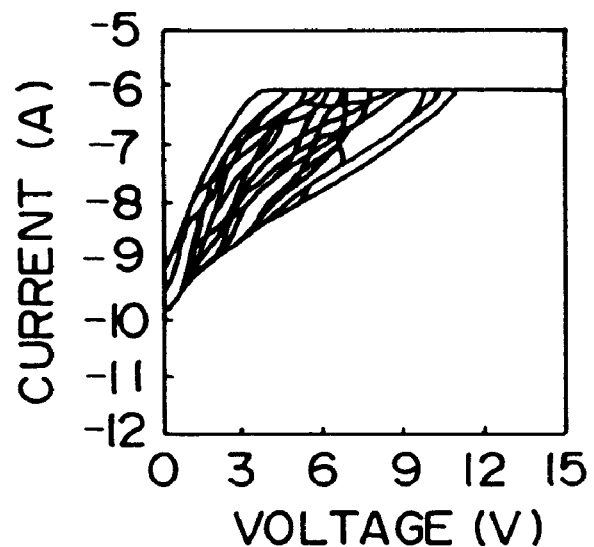
FIGS. 13A and 13B are characteristic views showing leakage current due to difference in peripheral lengths of the cobalt silicide layers which are formed according to the prior art and from which unreacted cobalt is removed after second annealing.
Figure 13B:
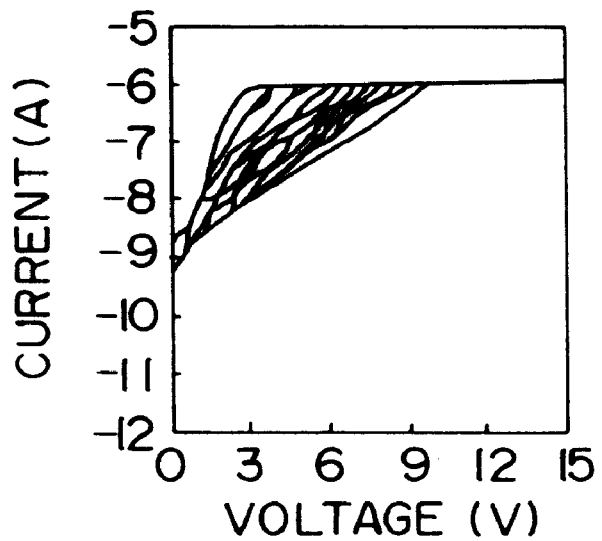

Then, after the cobalt silicide layer 33 made of $CoSi_2$ was formed by virtue of the second RTA executed at 825° C. for 30 seconds, if leakage current characteristics were examined with varying an area of the impurity diffusion layer 32, results shown in FIGS. 12A to 12C have been obtained. Also, if leakage current characteristics were examined by using a peripheral length of the impurity diffusion layer 32 as a parameter, results shown in FIGS. 13A and 13B have been obtained.

According to FIGS. 10A to 10C, FIGS. 11A to 11C, FIGS. 12A to 12C, and FIGS. 13A and 13B, leakage current characteristics obtained after first RTA have been inferior to those obtained after second RTA, and leakage current characteristics have been deteriorated much more as the area of the impurity diffusion layer 32 becomes wider or the peripheral length thereof becomes longer. This event is caused due to the spikes produced in the bottom of the cobalt silicide layer 33.

Next, the case will be explained where an upper layer portion of the impurity diffusion layer 32 is amorphized in advance by injecting germanium.

Figure 14A:
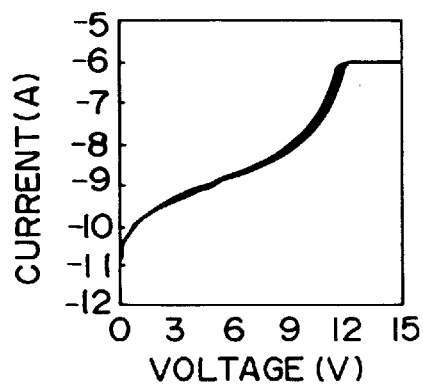
FIGS. 14A to 14C are characteristic views showing leakage current due to difference in areas of the cobalt silicide layers from which unreacted cobalt is removed after first annealing in the embodiment of the present invention.
Figure 14B:
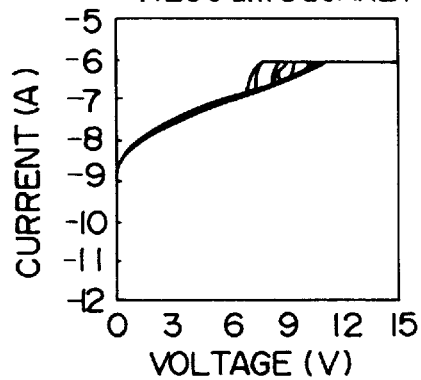
Figure 14C:
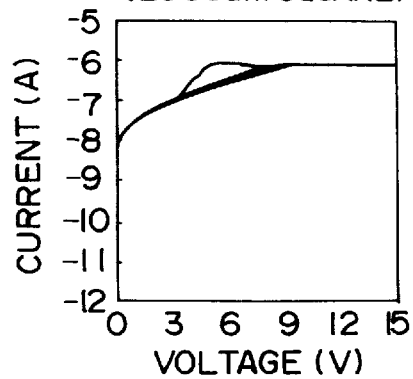
Figure 15A:
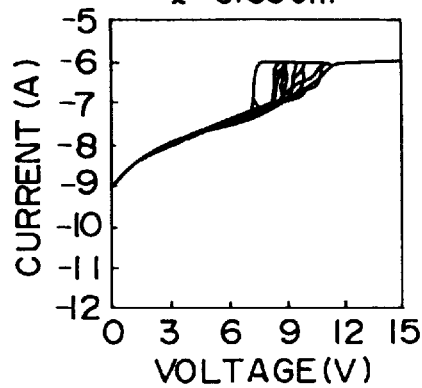
FIGS. 15A to 15C are characteristic views showing leakage current due to difference in peripheral lengths of the cobalt silicide layers from which unreacted cobalt is removed after first annealing in the embodiment of the present invention.
Figure 15B:
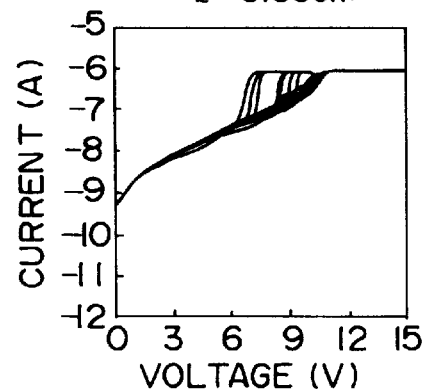
Figure 15C:
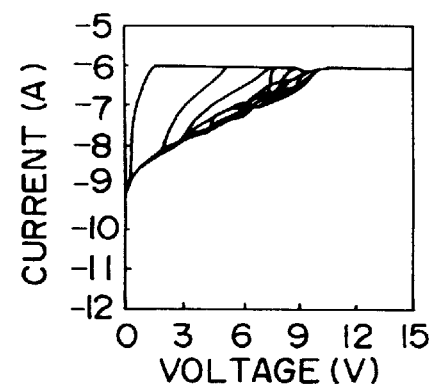

If the leakage current characteristics have been examined immediately after washout process via the first RTA carried out at 550° C. for 30 seconds while varying a flat area of the impurity diffusion layer 32, results shown in FIGS. 14A to 14C have been derived. Further, if leakage current characteristics were examined by varying a peripheral length of the impurity diffusion layer 32, results shown in FIGS. 15A to 15C have been obtained.

Figure 16A:
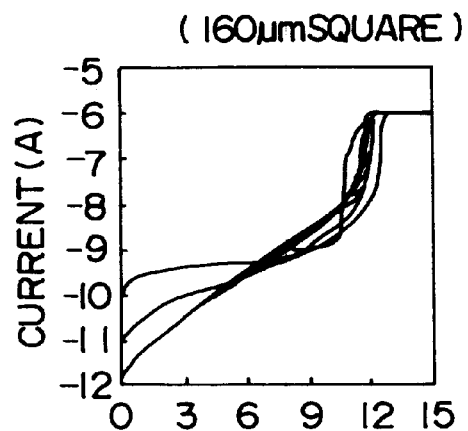
FIGS. 16A to 16C are characteristic views showing leakage current due to difference in areas of the cobalt silicide layers from which unreacted cobalt is removed after second annealing in the embodiment of the present invention.
Figure 16B:
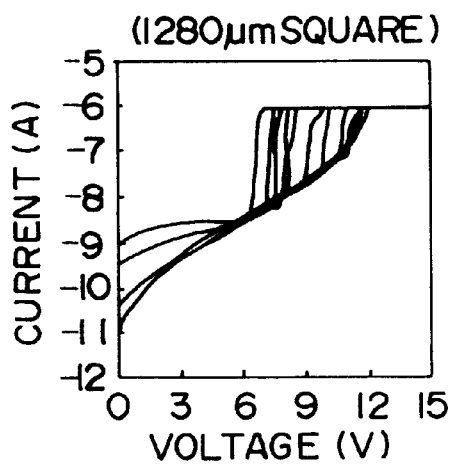
Figure 16C:
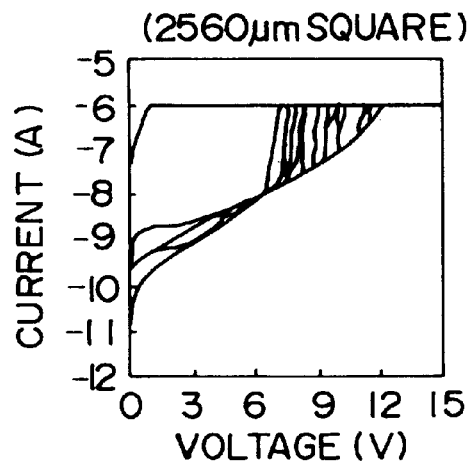
Figure 17A:
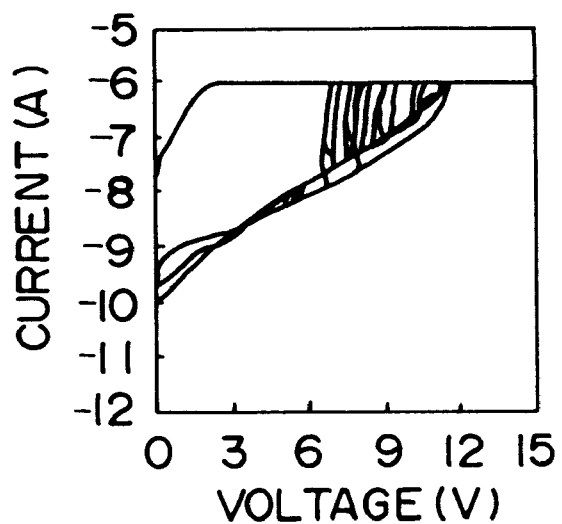
FIGS. 17A and 17B are characteristic views showing leakage current due to difference in peripheral lengths of the cobalt silicide layers from which unreacted cobalt is removed after second annealing in the embodiment of the present invention.
Figure 17B:
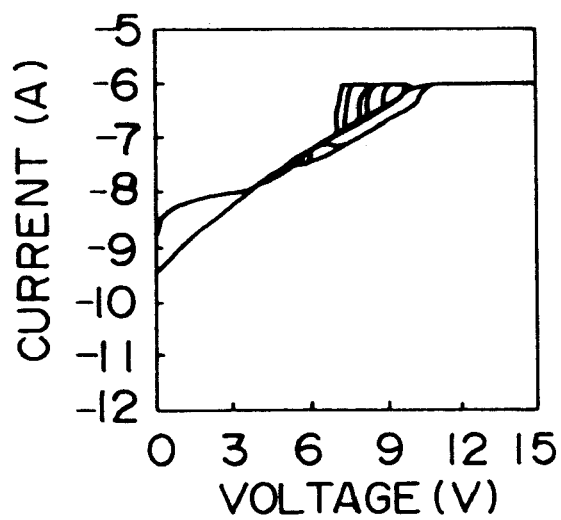

Then, after the cobalt silicide layer 33 made of $CoSi_2$ was formed by virtue of the second RTA executed at 825° C. for 30 seconds, if leakage current characteristics were examined while varying an area of the impurity diffusion layer 32, results shown in FIGS. 16A to 16C have been obtained. Also, if leakage current characteristics were examined by changing a peripheral length of the impurity diffusion layer 32, results shown in FIGS. 17A and 17B have been obtained.

According to FIGS. 14A to 14C, FIGS. 15A to 15C, FIGS. 16A to 16C, and FIGS. 17A and 17B, in the event that the impurity diffusion layer 32 was amorphized by injecting germanium, variation in leakage current characteristics was small and dependence of the impurity diffusion layer 32 on its area and its peripheral length hardly appeared.

Figure 18:
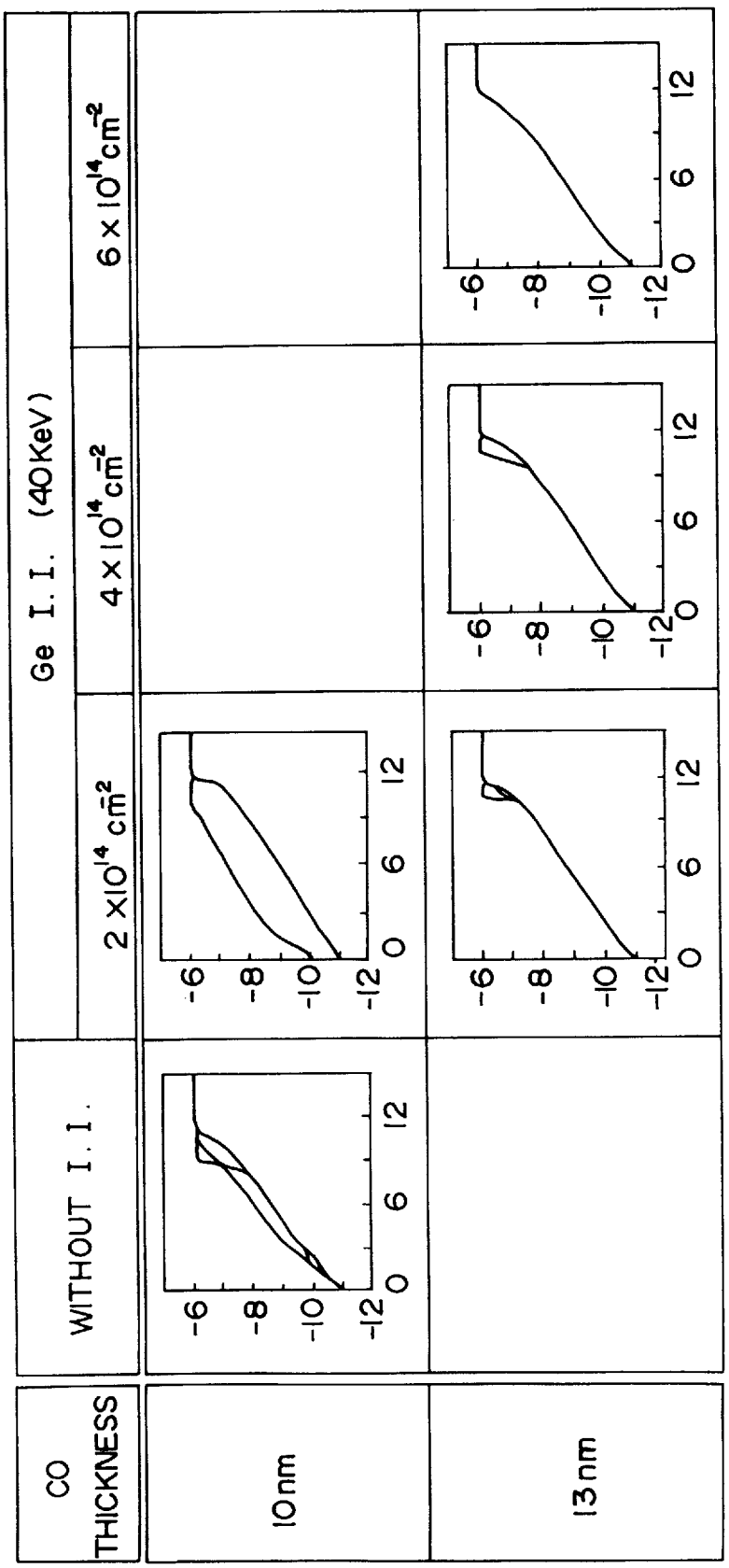
FIG. 18 is a characteristic view showing how the leakage current of the cobalt silicide layer is changed due to difference in thickness of cobalt films after second annealing when the embodiment of the present invention is compared with the prior art.
Figure 19:
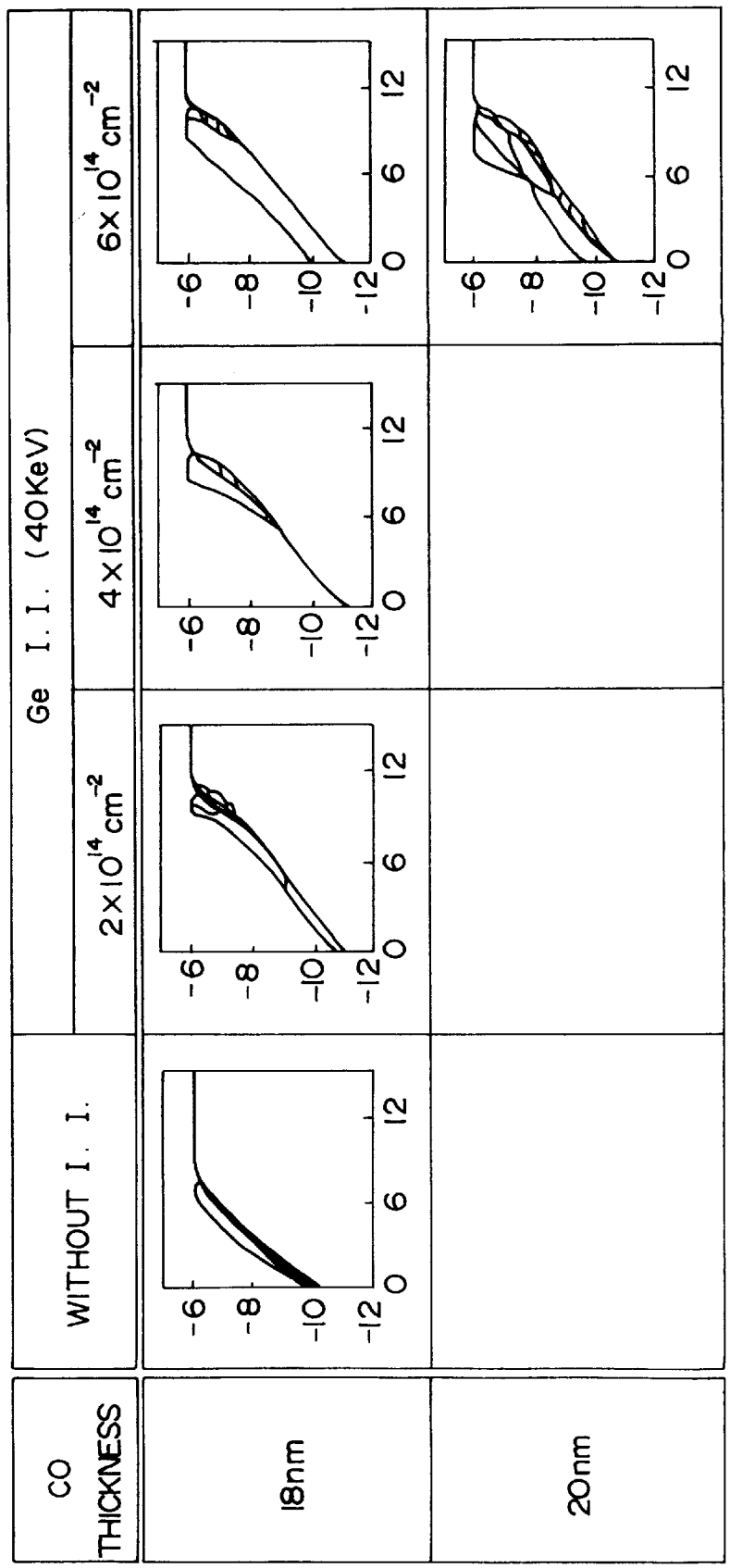
FIG. 19 is another characteristic view showing how the leakage current of the cobalt silicide layer is changed due to difference in thickness of the cobalt films after second annealing when the embodiment of the present invention is compared with the prior art.

Results concerning dependence of leakage current characteristics of the cobalt silicide layer 33 on cobalt film thickness after the second RTA are given in FIGS. 18 and 19.

It can be deduced from FIGS. 18 and 19 that difference in leakage current characteristics seldom appeared between the germanium ion-implanted cobalt film and the germanium not-ion-implanted cobalt film if the cobalt film has a 10 nm thickness, but obviously good leakage current characteristics were achieved in the germanium ion-implanted cobalt film rather than the germanium not-ion-implanted cobalt film if a thickness of the cobalt film was increased up to 18 nm.

If the cobalt silicide layer is formed to have a 18 nm thickness of the cobalt film, a sheet resistance of the cobalt silicide layer has become about 4 $\Omega/\square$ irrespective of germanium ion-implantation.

With the above experimental results, it has also been found that, if the cobalt film is amorphized by ion-implanting germanium into the silicon substrate before formation of the cobalt film, good junction characteristic could be attained with few area dependence, peripheral length dependence, and cobalt film thickness dependence of the impurity diffusion layer.

Various modifications will become possible for those skilled in the art after receiving the teachings of the present disclosure without departing from the scope thereof.

What is claimed is:

1. A method of manufacturing a semiconductor device, comprising the steps of:

introducing impurities into an upper surface region of a silicon layer and then annealing, to thereby form an impurity diffusion layer;

ion-implanting an element into the upper surface region of said silicon layer, to thereby form an amorphous layer;

forming a cobalt film on said amorphous layer;

annealing said cobalt film and said amorphous layer at a first temperature, to thereby form a cobalt silicide layer made of $Co_2Si$ or $CoSi$ in an upper surface region of said amorphous layer; and annealing said cobalt silicide layer and said silicon layer at a second temperature, to thereby change said $Co_2Si$ or $CoSi$ into $CoSi_2$ and also to make a depth of said cobalt silicide layer equal to or deeper than that of said amorphous layer.

2. The method according to claim 1, wherein said first temperature is below 450° C.

3. The method according to claim 1, wherein said second temperature is above 500° C. and is below a temperature at which the annealing to form said impurity diffusion layer is carried out.

4. The method according to claim 1, wherein said cobalt film is formed to have a thickness of 8 to 20 nm.

5. The method according to claim 1, further comprising, between said forming of the cobalt film and said annealing at the first temperature, a step of forming a cap layer on said cobalt film.

6. The method according to claim 5, wherein said cap layer is made of titanium nitride.

7. The method according to claim 1, wherein said element is one selected from the group consisting of germanium, silicon, and arsenic.

8. The method according to claim 7, wherein said germanium is ion-implanted with a dosage of more than $8 \times 10^{13}$ atoms/cm$^2$, said silicon is ion-implanted with a dosage of more than $8 \times 10^{14}$ atoms/cm$^2$, and said arsenic is ion-implanted with a dosage within a range of $8 \times 10^{13}$ atoms/cm$^2$ to $5 \times 10^{14}$ atoms/cm$^2$.

9. The method according to claim 1, further comprising, between said annealing at the first temperature and said annealing at the second temperature, a step of removing said cobalt film which has not reacted with said amorphous layer.

10. A method of manufacturing a semiconductor device, comprising the steps of:

forming a gate electrode via a gate insulating layer on a silicon layer;

introducing impurities into said silicon layer of both sides of said gate electrode and then annealing, to thereby form an impurity diffusion layer as a source/drain region;

ion-implanting an element into an upper surface region of said silicon layer, to thereby form an amorphous layer;

forming a cobalt film on said amorphous layer;

annealing said cobalt film and said amorphous layer at a first temperature, to thereby form a cobalt silicide layer made of Co$_2$Si or CoSi in an upper surface region of said amorphous layer;

removing said cobalt film which has not reacted with said amorphous layer; and annealing said cobalt silicide layer and said silicon layer at a second temperature, to thereby change said Co$_2$Si or CoSi into CoSi$_2$ and also to make a depth of said cobalt silicide layer equal to or deeper than that of said amorphous layer.

11. The method according to claim 10, wherein said gate electrode is made of polysilicon; an upper surface region of the gate electrode is made amorphous by ion-implanting said element thereinto; and said cobalt film is formed on the gate electrode.

12. The method according to claim 10, wherein said first temperature is below 450° C.

13. The method according to claim 10, wherein said second temperature is above 500° C. and is below a temperature at which the annealing to form said impurity diffusion layer is carried out.

14. The method according to claim 10, wherein said cobalt film is formed to have a thickness of 8 to 20 nm.

15. The method according to claim 10, further comprising, between said forming of a cobalt film and said annealing at the first temperature, a step of forming a cap layer on said cobalt film.

16. The method according to claim 15, wherein said cap layer is made of titanium nitride.

17. The method according to claim 10, wherein said element is one selected from the group of germanium, silicon, and arsenic.

18. The method according to claim 17, wherein said germanium is ion-implanted with a dosage of more than $8 \times 10^{13}$ atoms/cm$^2$, said silicon is ion-implanted with a dosage of more than $8 \times 10^{14}$ atoms/cm$^2$, and said arsenic is ion-implanted with a dosage within a range of $8 \times 10^{13}$ atoms/cm$^2$ to $5 \times 10^{14}$ atoms/cm$^2$.

* * * * *